US012637755B2

(12) United States Patent
Momotani et al.

(10) Patent No.: US 12,637,755 B2
(45) Date of Patent: May 26, 2026

(54) CUTTING TOOL

(71) Applicant: SUMITOMO ELECTRIC HARDMETAL CORP., Itami (JP)

(72) Inventors: Kihiro Momotani, Itami (JP); Yuta Suzuki, Itami (JP); Daiji Tabayashi, Itami (JP)

(73) Assignee: SUMITOMO ELECTRIC HARDMETAL CORP., Itami (JP)

( * ) Notice: Subject to any disclaimer, the term of this patent is extended or adjusted under 35 U.S.C. 154(b) by 0 days.

(21) Appl. No.: 18/998,611

(22) PCT Filed: Jun. 20, 2024

(86) PCT No.: PCT/JP2024/022407
§ 371 (c)(1),
(2) Date: Jan. 27, 2025

(87) PCT Pub. No.: WO2025/262880
PCT Pub. Date: Dec. 26, 2025

(65) Prior Publication Data
US 2025/0389013 A1 Dec. 25, 2025

(51) Int. Cl.
*C23C 14/32* (2006.01)
*B23B 27/14* (2006.01)
(Continued)

(52) U.S. Cl.
CPC .......... *C23C 14/325* (2013.01); *B23B 27/148* (2013.01); *C23C 14/022* (2013.01); *C23C 14/0647* (2013.01); *C23C 14/0664* (2013.01)

(58) Field of Classification Search
None
See application file for complete search history.

(56) References Cited

U.S. PATENT DOCUMENTS 8,293,359 B2 * 10/2012 Kathrein ................. C23C 16/36 51/307
2005/0170162 A1 * 8/2005 Yamamoto ............ C23C 28/347 204/192.15
(Continued)

FOREIGN PATENT DOCUMENTS

JP 2006224222 A * 8/2006
JP 2020-138301 A 9/2020
(Continued)

OTHER PUBLICATIONS

Written Opinion mailed on Aug. 6, 2024, received for PCT Application PCT/JP2024/022407, filed on Jun. 20, 2024, 7 pages including English Translation.

*Primary Examiner* — Seth Dumbris
(74) *Attorney, Agent, or Firm* — XSENSUS LLP

(57) ABSTRACT

A cutting tool includes: a substrate; and a coating film including a first layer and a second layer, the first layer consists of a multilayer structure consisting of a first unit layer composed of $Ti_aAl_{1-a-b}B_bN$, and the second unit layer composed of TiN, where $0.30 \leq a \leq 0.50$ and $0.005 \leq b \leq 0.10$, the second layer is composed of $TiC_xN_{1-x}$, where $0.05 \leq x \leq 0.40$, the second layer includes a first region and a second region, in the first region, an average C1 of percentages of the numbers of carbon atoms with respect to totals of the numbers of the carbon atoms and the numbers of nitrogen atoms is 25% or more and 50% or less, in the second region, an average C2 of percentages of the numbers of carbon atoms with respect to totals of the numbers of the carbon atoms and the numbers of nitrogen atoms is 1% or more and 10% or less.

3 Claims, 8 Drawing Sheets

(51) Int. Cl.
*C23C 14/02* (2006.01)
*C23C 14/06* (2006.01)

(56) References Cited

U.S. PATENT DOCUMENTS

| | | | | |
|---|---|---|---|---|
| 2012/0164418 | A1* | 6/2012 | Chang | C23C 28/40<br>204/192.1 |
| 2020/0368822 | A1* | 11/2020 | Fukui | C23C 14/0641 |
| 2021/0046553 | A1 | 2/2021 | Tanaka et al. | |
| 2023/0201930 | A1* | 6/2023 | Suzuki | C23C 14/325<br>428/212 |
| 2023/0398607 | A1* | 12/2023 | Suzuki | C04B 41/524 |
| 2023/0405686 | A1 | 12/2023 | Suzuki et al. | |
| 2024/0198431 | A1 | 6/2024 | Fukui et al. | |

FOREIGN PATENT DOCUMENTS

| | | | |
|---|---|---|---|
| JP | 7226688 | B2 | 2/2023 |
| JP | 7305054 | B2 | 7/2023 |
| JP | 7380978 | B1 | 11/2023 |
| WO | 2019/171653 | A1 | 9/2019 |
| WO | 2020/213263 | A1 | 10/2020 |

* cited by examiner

CUTTING TOOL

CROSS-REFERENCE TO RELATED APPLICATION

This application is a national stage application, pursuant to 35 U.S.C. § 371, of International Patent Application No. PCT/JP2024/022407, filed Jun. 20, 2024, the entire contents of which are incorporated herein by reference.

TECHNICAL FIELD

The present disclosure relates to a cutting tool.

BACKGROUND ART

Conventionally, in order to improve performance of a cutting tool, development has been advanced with regard to a coating film that coats a surface of a substrate composed of a cemented carbide, a cubic boron nitride sintered material, or the like (PTL 1).

CITATION LIST

Patent Literature

PTL 1: WO 2020/213263

SUMMARY OF INVENTION

A cutting tool according to an embodiment of the present disclosure includes: a substrate; and a coating film provided on the substrate, wherein the coating film includes a first layer provided on the substrate and a second layer provided directly on the first layer, the first layer consists of a multilayer structure in which two types of unit layers consisting of a first unit layer and a second unit layer are alternately layered, the first unit layer is composed of $Ti_aAl_{1-a-b}B_bN$, the second unit layer is composed of TiN, where 0.30≤a≤0.50 and 0.005≤b≤0.10, in the first layer, an average T1 of percentages of the numbers of titanium atoms with respect to totals of the numbers of the titanium atoms and the numbers of aluminum atoms is 60% or more, an average thickness of the first unit layer is 2 nm or more and 50 nm or less, an average thickness of the second unit layer is 2 nm or more and 50 nm or less, in the first layer, a unit layer in contact with the second layer is the second unit layer, a thickness of the first layer is 0.5 μm or more and 5 μm or less, the second layer is composed of $TiC_xN_{1-x}$, where 0.05≤x≤0.40, the second layer includes a first region sandwiched between a first surface of the second layer on a surface side of the coating film and an imaginary plane P1 at which a distance from the first surface to the second layer side is 10% with respect to a film thickness of the second layer, and a second region sandwiched between an interface between the second layer and the first layer and an imaginary plane P2 at which a distance from the interface to the second layer side is 40% with respect to the film thickness of the second layer, in the first region, an average C1 of percentages of the numbers of carbon atoms with respect to totals of the numbers of the carbon atoms and the numbers of nitrogen atoms is 25% or more and 50% or less, in the second region, an average C2 of percentages of the numbers of carbon atoms with respect to totals of the numbers of the carbon atoms and the numbers of nitrogen atoms is 1% or more and 10% or less, and the thickness of the second layer is 0.5 μm or more and 5.0 μm or less.

DETAILED DESCRIPTION

Figure 1:
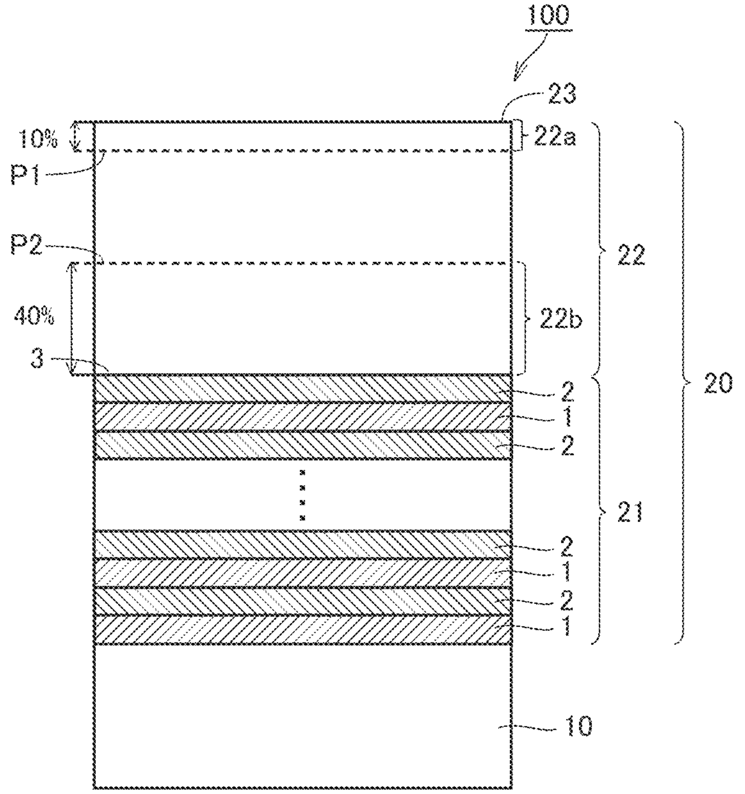
FIG. 1 is a schematic cross sectional view showing an exemplary configuration of a cutting tool according to a first embodiment.

Problem to be Solved by the Present Disclosure

In recent years, a demand for cost reduction has been increased and a tool has been required to have a longer life. For example, a cutting tool having a long tool life has been required also in a process for stainless steel.

In view of this, an object of the present disclosure is to provide a cutting tool having a long tool life particularly in a process for stainless steel.

Advantageous Effect of the Present Disclosure

According to the present disclosure, it is possible to provide a cutting tool having a long tool life particularly in a process for stainless steel.

DESCRIPTION OF EMBODIMENTS

First, embodiments of the present disclosure will be listed and described.

(1) A cutting tool according to the present disclosure includes: a substrate; and a coating film provided on the substrate, wherein the coating film includes a first layer provided on the substrate and a second layer provided directly on the first layer, the first layer consists of a multilayer structure in which two types of unit layers consisting of a first unit layer and a second unit layer are alternately layered, the first unit layer is composed of $Ti_aAl_{1-a-b}B_bN$, the second unit layer is composed of TiN, where 0.30≤a≤0.50 and 0.005≤b≤0.10, in the first layer, an average T1 of percentages of the numbers of titanium atoms with respect to totals of the numbers of the titanium atoms and the numbers of aluminum atoms is 60% or more, an average thickness of the first unit layer is 2 nm or more and 50 nm or less, an average thickness of the second unit layer is 2 nm or more and 50 nm or less, in the first layer, a unit layer in contact with the second layer is the second unit layer, a thickness of the first layer is 0.5 μm or more and 5 μm or less, the second layer is composed of $TiC_xN_{1-x}$, where 0.05≤x≤0.40, the second layer includes a first region sandwiched between a first surface of the second layer on a surface side of the coating film and an imaginary plane P1 at which a distance from the first surface to the second layer side is 10% with respect to a film thickness of the second layer, and a second region sandwiched between an interface between the second layer and the first layer and an imaginary plane P2 at which a distance from the interface to the second layer side is 40% with respect to the film thickness of the second layer, in the first region, an average C1 of percentages of the numbers of carbon atoms with respect to totals of the numbers of the carbon atoms and the numbers of nitrogen atoms is 25% or more and 50% or less, in the second region, an average C2 of percentages of the numbers of carbon atoms with respect to totals of the numbers of the carbon atoms and the numbers of nitrogen atoms is 1% or more and 10% or less, and the thickness of the second layer is 0.5 μm or more and 5.0 μm or less.

According to the present disclosure, it is possible to provide a cutting tool having a long tool life particularly in a process for stainless steel.

(2) In (1), a percentage C11, a percentage C12, a percentage C13, and a percentage C14 may indicate a relation of C11<C12<C13<C14, the percentage C11 being a percentage of the number of carbon atoms with respect to a total of the number of the carbon atoms and the number of nitrogen atoms at the interface between the second layer and the first layer, the percentage C12 being a percentage of the number of carbon atoms with respect to a total of the number of the carbon atoms and the number of nitrogen atoms at the imaginary plane P2, the percentage C13 being a percentage of the number of carbon atoms with respect to a total of the number of the carbon atoms and the number of nitrogen atoms at the imaginary plane P1, the percentage C14 being a percentage of the number of carbon atoms with respect to a total of the number of the carbon atoms and the number of nitrogen atoms at the first surface. According to this, chipping of the coating film is suppressed.

(3) In (1) or (2), a thickness of the coating film may be 1.0 μm or more and 10 μm or less. When the thickness of the coating film is 1.0 μm or more, wear resistance is improved. When the thickness of the coating film is 10 μm or less, breakage resistance is improved.

Details of Embodiments of the Present Disclosure

A specific example of the cutting tool of the present disclosure will be described below with reference to figures. In the figures of the present disclosure, the same reference characters represent the same or corresponding portions. Further, a dimensional relation such as a length, a width, a thickness, or a depth is appropriately changed for clarity and simplification of the figures, and therefore do not necessarily represent an actual dimensional relation.

In the present disclosure, the expression "A to B" means A or more and B or less, and when no unit is indicated for A and a unit is indicated only for B, the unit of A is the same as the unit of B.

When a compound or the like is expressed by a chemical formula in the present disclosure and an atomic ratio is not particularly limited, it is assumed that all the conventionally known atomic ratios are included, and the atomic ratio should not be necessarily limited only to one in the stoichiometric range.

In the present disclosure, when one or more numerical values are described as each of lower and upper limits of a numerical range, it is assumed that a combination of any one numerical value described as the lower limit and any one numerical value described as the upper limit is also disclosed.

In the present disclosure, the terms "comprise", "include", "have", and variations thereof are open-ended terms. Each of the open-ended terms may or may not further include an additional element in addition to an essential element. The description "consist of" is a closed term. It should be noted that even a configuration expressed by such a closed term can include an impurity introduced in an ordinary case or an additional element irrelevant to the target technology.

First Embodiment: Cutting Tool

A cutting tool according to one embodiment (hereinafter, also referred to as "first embodiment") of the present disclosure will be described with reference to FIG. 1. As shown in FIG. 1, a cutting tool 100 according to the first embodiment is a cutting tool 100 including a substrate 10 and a coating film 20 provided on substrate 10. Coating film 20 includes a first layer 21 provided on substrate 10 and a second layer 22 provided directly on first layer 21. First layer 21 consists of a multilayer structure in which two types of unit layers consisting of first unit layers 1 and second unit layers 2 are alternately layered Each of first unit layers 1 is composed of $Ti_aAl_{1-a-b}B_bN$. Each of second unit layers 2 is composed of TiN. Here, 0.30≤a≤0.50 and 0.005≤b≤0.10. In first layer 21, an average T1 of percentages of the numbers of titanium atoms with respect to totals of the numbers of the titanium atoms and the numbers of aluminum atoms is 60% or more. An average thickness of first unit layer 1 is 2 nm or more and 50 nm or less. An average thickness of second unit layer 2 is 2 nm or more and 50 nm or less. In first layer 21, a unit layer in contact with second layer 22 is second unit layer 2. A thickness of first layer **2*l* is 0.5 pin or more and 5 μm or less. Second layer 22 is composed of $TiC_xN_{1-x}$. Here, 0.055≤x≤0.40. Second layer 22 includes a first region 22*a* sandwiched between a first surface 23 of second layer 22 on a surface side of coating film 20 and an imaginary plane P1 at which a distance from first surface 23 to the second layer 22 side is 10% with respect to a film thickness of second layer 22, and a second region 22*b* sandwiched between an interface 3 between second layer 22 and first layer 21 and an imaginary plane P2 at which a distance from interface 3 to the second layer 22 side is 40% with respect to the film thickness of second layer 22. In first region 22*a*, an average C1 of percentages of the numbers of carbon atoms with respect to totals of the numbers of the carbon atoms and the numbers of nitrogen atoms is 25% or more and 50% or less. In second region 22*b*, an average C2 of percentages of the numbers of carbon atoms with respect to totals of the numbers of the carbon atoms and the numbers of nitrogen atoms is 1% or more and 10% or less. The thickness of second layer 22** is 0.5 μm or more and 5.0 μm or less.

The cutting tool of the present disclosure can have a long tool life. A reason therefor is presumed as follows.

(i) The coating film of the cutting tool of the present disclosure includes the first layer consisting of the multilayer structure in which the two types of unit layers consisting of the first unit layers and the second unit layers are alternately layered. Each first unit layer and each second unit layer have different compositions. Therefore, it is possible to suppress progress of crack from the surface of the coating film in the vicinity of the interface between the first unit layer and the second unit layer during use of the cutting tool.

(ii) The first unit layer is composed of $Ti_aAl_{1-a-b}B_bN$ (0.30≤a≤0.50 and 0.005≤b≤0.10). The hardness of the first unit layer is improved due to a small amount of boron (B) being added to TiAlN. The second unit layer is composed of TiN. The second unit layer has excellent high-temperature stability. In the present disclosure, since the first layer consists of the multilayer structure in which the first unit layers each having the high hardness and the second unit layers each having the excellent high-temperature stability are alternately layered, stable hardness is obtained even under a high temperature and crater wear resistance is improved. Crater wear is wear generated mainly at a rake face of the cutting tool due to frictional heat between the cutting tool and a chip. Further, since the first layer consists of the multilayer structure in which the first unit layers each having the high hardness and the second unit layers each having lower hardness than that of the first unit layer are alternately layered, breakage resistance is also improved Thus, the crater wear resistance and the breakage resistance of the coating film are improved in a balanced manner, with the result that the cutting tool has a long tool life.

(iii) The first unit layer and the second unit layer have different compositions. Therefore, the first unit layer and the second unit layer have different crystal lattices, and a strain of the crystal lattice is generated in the first layer and the first layer can have high hardness. Thus, the coating film including the first layer can have excellent wear resistance.

(iv) In the first layer, average T1 of the percentages of the numbers of the titanium atoms to the totals of the numbers of the titanium atoms and the number of the aluminum atoms is 60% or more. According to this, the first layer can have excellent crater wear resistance, with the result that the cutting tool has a long tool life.

(v) The coating film of the cutting tool of the present disclosure includes the second layer composed of $TiC_xN_{1-x}$ (0.05≤x≤0.40). The second layer has excellent lubricity. In the first region of the second layer on the surface side of the coating film, average C1 of the percentages of the numbers of the carbon atoms with respect to the totals of the numbers of the carbon atoms and the numbers of the nitrogen atoms is 25% or more and 50% or less. The first region on the surface side of the coating film has very excellent lubricity. Therefore, even when stainless steel, for which welding is likely to occur, is processed using the cutting tool of the present disclosure, the occurrence of welding is suppressed. Therefore, the coating film including the second layer can have excellent welding resistance and excellent breakage resistance.

(vi) In the first layer, the unit layer in contact with the second layer is the second unit layer. In the second region in contact with the first layer, average C2 of the percentages of the numbers of the carbon atoms with respect to the totals of the numbers of the carbon atoms and the numbers of the nitrogen atoms is 1% or more and 10% or less. According to this, adhesion between the second unit layer and the second region is improved, thereby suppressing occurrence of film detachment between the first layer and the second layer.

<Cutting Tool>

As long as the cutting tool of the first embodiment is a cutting tool, the shape, purpose of use, and the like thereof are not particularly limited. Examples of the cutting tool according to the first embodiment include a drill, an end mill, an indexable insert for milling, an indexable insert for turning, a metal saw, a gear cutting tool, a reamer, a tap, a crankshaft pin milling insert, and the like.

FIG. 1 is a schematic partial cross sectional view showing an exemplary configuration of the cutting tool according to the first embodiment. A cutting tool 100 includes a substrate 10 and a coating film 20 provided on substrate 10. Coating film 20 includes a first layer 21 provided on substrate 10 and a second layer 22 provided directly on first layer 21. First layer 21 consists of a multilayer structure in which two types of unit layers consisting of first unit layers 1 and second unit layers 2 are alternately layered.

<<Substrate>>

The composition of the substrate is not particularly limited. The composition of the substrate may be, for example, a cemented carbide, cermet, high-speed steel, ceramic, cubic boron nitride sintered material, diamond sintered material, or the like. The substrate is preferably composed of the cemented carbide. This is because the cemented carbide has excellent wear resistance.

The cemented carbide is a sintered material including WC (tungsten carbide) grains as a main component. The cemented carbide includes a hard phase and a binder phase. The hard phase contains the WC grains. The binder phase binds the WC grains together. The binder phase contains, for example, Co (cobalt) or the like. The binder phase may further contain, for example, TiC (titanium carbide), TaC (tantalum carbide), NbC (niobium carbide), or the like.

The cemented carbide may contain an impurity inevitably introduced therein in the course of manufacturing. The cemented carbide may also include free carbon or an abnormal layer called "η layer" in its structure. Further, the cemented carbide may be subjected to a surface modification treatment. For example, the cemented carbide may include a β-free layer or the like in its surface.

The cemented carbide may contain 85 mass % or more and 98 mass % or less of the WC grains and 2 mass % or more and 15 mass % or less of Co. The average grain size of the WC grains may be 0.2 μm or more and 4 μm or less.

Co is softer than the WC grains. When a surface of the substrate is subjected to ion bombardment treatment, soft Co can be removed as described later. Since the cemented carbide has the above-described composition and the WC grains have the above-described average grain size, an appropriate degree of unevenness is formed in the surface from which the Co has been removed. It is considered that by forming the coating film on such a surface, an anchor effect is exhibited to improve adhesion between the coating film and the substrate.

Here, the grain size of each WC grain indicates the diameter of a circle circumscribed around a two-dimensional projection image of the WC grain. The grain size is measured using a scanning electron microscope (SEM) or a transmission electron microscope (TEM). That is, the cemented carbide is cut and the cut surface is observed by the SEM or TEM. In the observation image, the diameter of the circle circumscribed around the WC grain is regarded as the grain size of the WC grain. In the observation image, the grain sizes of 10 or more (preferably 50 or more, and more preferably 100 or more) WC grains randomly extracted are measured, and the arithmetic average value thereof is defined as the average grain size of the WC grains. For the observation, it is desirable to process the cross section of the cut surface by a cross section polisher (CP), a focused ion beam (FIB), or the like.

<<Coating Film>>

The coating film is provided on the substrate. The coating film may be provided on a portion of the surface of the substrate, or may be provided on the whole of the surface thereof. It should be noted that the coating film is provided at least at a portion of the surface of the substrate corresponding to a cutting edge. In the present disclosure, the portion of the surface of the substrate corresponding to the cutting edge means a region at a distance of 0.5 mm or less or 2 mm or less from a cutting edge ridgeline in the surface of the substrate. As long as the effect of the present disclosure is not impaired, a coating film not formed on at least a part of the portion corresponding to the cutting edge is not departed from the scope of the present disclosure.

The coating film includes the first layer and the second layer. The first layer may be provided directly on the substrate. The second layer may be the outermost layer of the coating film. The coating film can consist of the first layer provided directly on the substrate and the second layer provided directly on the first layer. The coating film may include another layer in addition to the first layer and the second layer as long as the effect of the present disclosure is not impaired. For example, the coating film can include one or both of an underlying layer provided between the substrate and the first layer, and a surface layer provided on the outermost surface of the coating film. The underlying layer can include at least one layer selected from a group consisting of a TiAlN layer, a TiAlSiN layer, and a TiAlBN layer. The surface layer can include at least one layer selected from a group consisting of a TiC layer, a TiN layer, and a TiCN layer.

The layering configuration of the coating film does not need to be uniform across the whole of the coating film, and may be partially different.

The thickness of the coating film may be 1.0 μm or more and 10 μm or less, may be 1.5 μm or more and 9 μm or less, or may be 2.0 μm or more and 8 μm or less. The thickness of the coating film means the total of the thicknesses of the respective layers included in the coating film. Examples of the "layers included in the coating film" include the first layer, the second layer, the underlying layer, the surface layer, and the like.

The thickness of each of the layers included in the coating film is measured by obtaining a thin-piece sample (hereinafter, also referred to as "cross section sample") with a cross section parallel to the normal direction of the surface of the cutting tool and by observing the cross section sample using a scanning transmission electron microscope (STEM). Examples of the scanning transmission electron microscope include JEM-2100F (trade name) provided by JEOL. An observation magnification for the cross section sample is 5,000× to 10,000×, the thicknesses at five positions of the layer are measured, and the arithmetic average value thereof is defined as the "thickness of each layer".

As long as the measurement is performed for the same cutting tool, it has been confirmed that there are no variations in measurement results even when the measurement positions are freely selected.

<<First Layer>>

The first layer consists of the multilayer structure in which the first unit layers and the second unit layers are alternately layered. The number of the layered layers is not particularly limited as long as the average thickness of each of the first unit layer and the second unit layer is 2 nm or more and 50 nm or less. The number of the layered layers indicates each of the number of the first unit layers and the number of the second unit layers in the first layer. The number of the layered layers may be 10 or more and 5000 or less, may be 50 or more and 5000 or less, may be 250 or more and 2000 or less, or may be 500 or more and 1000 or less.

In the first layer, the unit layer in contact with the second layer is the second unit layer. In the first layer, the layer closest to the substrate may be the first unit layer or the second unit layer.

The thickness of the first layer is 0.5 μm or more and 5 μm or less, may be 0.6 μm or more and 4 μm or less, may be 0.7 μm or more and 3 μm or less, or may be 0.8 μm or more and 2 μm or less. When the thickness of the first layer is 0.5 μm or more, the wear resistance is improved. When the thickness of the first layer is 5 μm or less, the breakage resistance is improved.

<<Average Thicknesses of First Unit Layer and Second Unit Layer>>

The average thickness of the first unit layer is 2 nm or more and 50 nm or less, and the average thickness of the second unit layer is 2 nim or more and 50 nm or less By alternately layering such thin layers in the first layer, progress of crack can be suppressed. When one or both of the average thickness of the first unit layer and the average thickness of the second unit layer is less than 2 nm, the compositions of the first unit layer and the second unit layer may be mixed with each other to reduce the effect of suppressing the progress of crack. When one or both of the average thickness of the first unit layer and the average thickness of the second unit layer is more than 50 nm, an effect of suppressing delamination may be reduced. The average thickness of the first unit layer and the average thickness of the second unit layer may be the same or different.

The average thickness of the first unit layer is 2 nm or more and 50 nm or less, may be 4 nm or more and 40 nm or less, or may be 6 nm or more and 30 nm or less.

The average thickness of the second unit layer is 2 nm or more and 50 nm or less, may be 4 nm or more and 40 nm or less, or may be 6 nm or more and 30 nm or less.

Each of the average thickness of the first unit layer and the average thickness of the second unit layer is measured as follows. A thin-piece sample (hereinafter, also referred to as "cross section sample") of the cutting tool with a cross section parallel to the normal direction of the surface of the cutting tool is obtained. The cross section sample is observed using a scanning transmission electron microscope (STEM). Examples of the scanning transmission electron microscope include JEM-2100F (trade name) provided by JEOL. An observation magnification for the cross section sample is appropriately adjusted in accordance with each of the thicknesses of the first unit layer and the second unit layer. For example, the observation magnification can be about 1,000,000×. In one first unit layer, the thicknesses at five positions are measured. The arithmetic average value of the thicknesses at the five positions in the first unit layer is calculated, and the arithmetic average value thereof is defined as the average thickness of the first unit layer. In one second unit layer, the thicknesses at five positions are measured. The arithmetic average value of the thicknesses at the five positions in the second unit layer is calculated, and the arithmetic average value thereof is defined as the average thickness of the second unit layer.

For each of the five different first unit layers, the average thickness of the first unit layer is measured in the procedure described above. The arithmetic average value of the average thicknesses of the five first unit layers is found. In the present disclosure, the arithmetic average value thereof is defined as the average thickness of the first unit layer. For each of the five different second unit layers, the average thickness of the second unit layer is measured in the procedure described above. The arithmetic average value of the average thicknesses of the five second unit layers is found. In the present disclosure, the arithmetic average value thereof is defined as the average thickness of the second unit layer.

As long as the measurement is performed for the same cutting tool, it has been confirmed that there are no variations in measurement results even when the measurement positions are freely selected.

<<Compositions of First Unit Layer and Second Unit Layer>>

In the cutting tool of the present disclosure, the first unit layer is composed of $Ti_aAl_{1-a-b}B_bN$ ($0.30 \leq a \leq 0.50$ and $0.005 \leq b \leq 0.10$). The second unit layer is composed of TiN. As long as the effects of the present disclosure are not impaired, the first unit layer can include an inevitable impurity as well as $Ti_aAl_{1-a-b}B_bN$ The first unit layer can consist of $Ti_aAl_{1-a-b}B_bN$ and the inevitable impurity. As long as the effects of the present disclosure are not impaired, the second unit layer can include an inevitable impurity as well as TiN. The second unit layer may consist of TiN and the inevitable impurity Examples of the inevitable impurities include carbon (C) and oxygen (O).

In the first unit layer, a may satisfy $0.33 \leq a \leq 0.47$ or $0.36 \leq a \leq 0.44$.

In the first unit layer, b may satisfy $0.01 \leq b \leq 0.09$ or $0.02 \leq b \leq 0.08$.

The composition of each of the first unit layer and the second unit layer is measured by energy dispersive X-ray spectrometry (EDX). For the composition analysis, an EDX (TEM-DEX) accompanied with the transmission electron microscope (TEM) is used Examples of the EDX device include JED-2300 (trademark) provided by JEOL.

The composition analysis is performed in the following procedure. A thin-piece sample (hereinafter, also referred to as "cross section sample") with a cross section parallel to the normal direction of the surface of the cutting tool is obtained. While observing the cross section sample with the TEM, an EDX analysis is performed at each of five freely selected points in one first unit layer or one second unit layer. The first unit layer and the second unit layer can be distinguished from each other by a contrast difference. Here, it is assumed that the "five freely selected points" are points selected from different crystal grains. Each of the compositions of the first unit layer and the second unit layer is specified by arithmetically averaging the composition ratios obtained for each element by the measurements at the five points.

For each of five different first unit layers, the composition of the first unit layer is specified in the procedure described above. In the present disclosure, the average of the compositions of the five first unit layers is defined as the composition of the first unit layer, and a and b in $Ti_aAl_{1-a-b}B_bN$ are specified based on this. For each of five different second unit layers, the composition of the second unit layer is specified in the procedure described above. In the present disclosure, the average of the compositions of the five second unit layers is defined as the composition of the second unit layer.

As long as the measurement is performed for the same cutting tool, it has been confirmed that there are no variations in measurement results even when the measurement points are freely selected.

<<Composition of First Layer>>

In the first layer, average T1 (hereinafter, also referred to as "average T1") of percentages of the numbers of titanium atoms with respect to totals of the numbers of the titanium atoms and the numbers of aluminum atoms is 60% or more. According to this, the first layer can have excellent crater wear resistance. Average T1 may be 60% or more and 80% or less, may be 63% or more and 77% or less, or may be 66% or more and 75% or less.

Average T1 is measured by the TEM-DX. Examples of the EDX device include JFD-2300 (trade name) provided by JEOL. Average T1 is measured in the following procedure.

A thin-piece sample (hereinafter, also referred to as "cross section sample") with a cross section parallel to the normal direction of the surface of the cutting tool is obtained. While observing the cross section sample by the TEM, an EDX analysis is performed in the first layer at each of freely selected five visual fields so as to measure a percentage T of the number of titanium atoms with respect to the total of the number of the titanium atoms and the number of aluminum atoms. Here, the "freely selected five visual fields" are set so as not to overlap with one another. The range of one visual field is 200×200 nm. In the present disclosure, the arithmetic average of percentages T obtained by performing the measurements at the five visual fields is defined as average T1 in the first layer.

As long as the measurement is performed for the same cutting tool, it has been confirmed that there are no variations in measurement results even when the measurement points are freely selected.

<<Positional Relation Between Crystal Grain and Each of First Unit Layer and Second Unit Layer>>

Figure 8:
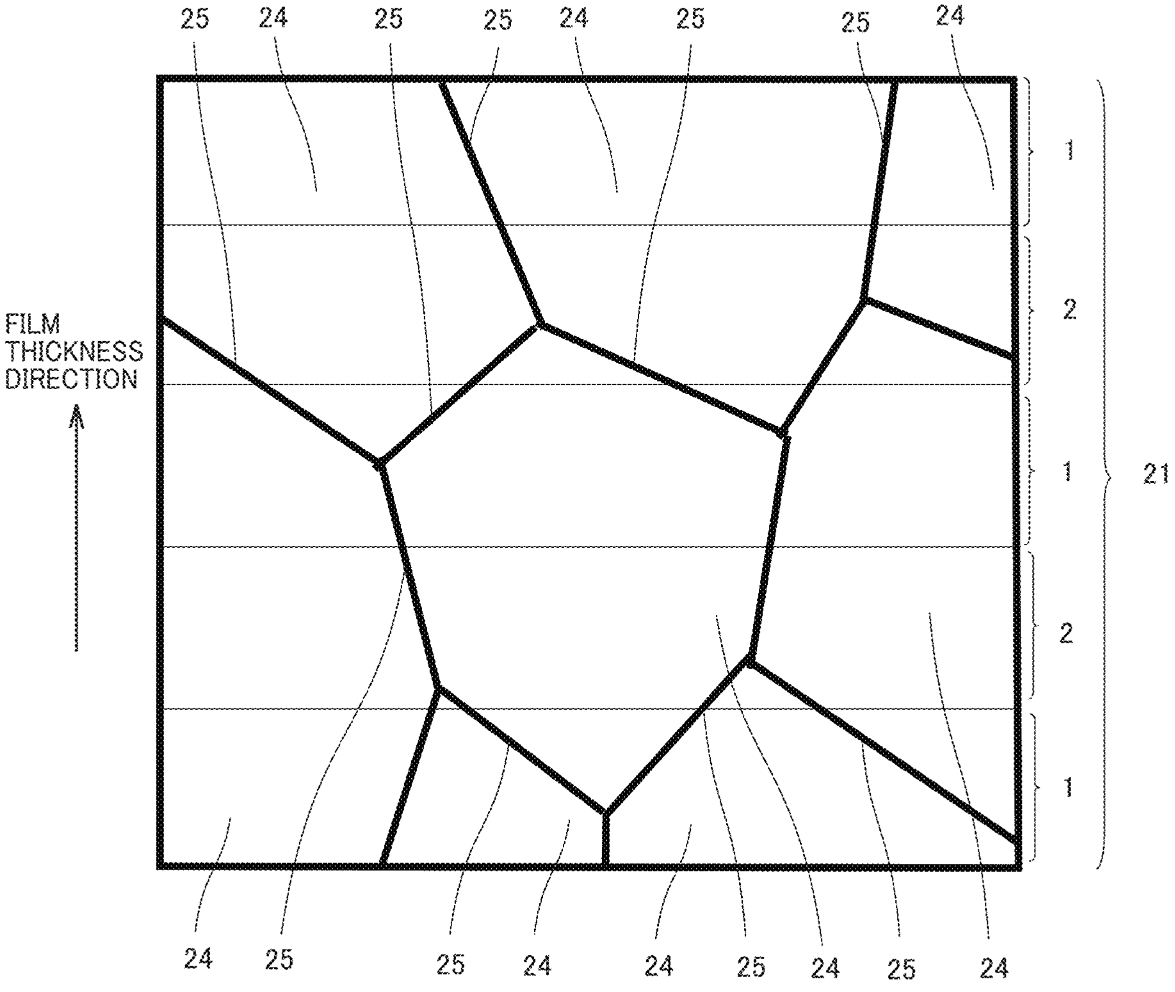
FIG. 8 is a diagram for illustrating a positional relation between the crystal grain and each of first and second unit layers.

A positional relation between a crystal grain and each of the first and second unit layers will be described with reference to FIG. 8. FIG. 8 is a diagram schematically showing a cross section along a film thickness direction of the first layer according to the first embodiment. As shown in FIG. 8, first layer 21 consists of the multilayer structure in which first unit layers 1 and second unit layers 2 are alternately layered. FIG. 8 shows a plurality of crystal grains 24, and boundaries between crystal grains 24 are shown as grain boundaries 25. Each crystal grain 24 may consist only of the first unit layer or the second unit layer. Further, each crystal grain 24 can exist to extend over one or more first unit layers and one or more second unit layers. That is, each crystal grain 24 can have a lamellar structure in which the first and second unit layers are alternately layered.

<<Composition of Second Layer>>

The second layer is composed of $TiC_xN_{1-x}$ ($0.05 \leq x \leq 0.40$). When x is 0.05 or more, the lubricity of the second layer is improved. When x is 0.40 or less, oxidation resistance is improved. In the present disclosure, the expression "the second layer is composed of $TiC_xN_{1-x}$ ($0.05 \leq x \leq 0.40$)" means that the average composition of the whole of the second layer is $TiC_xN_{1-x}$ ($0.0 \leq x \leq 0.40$).

In the second layer, x may satisfy $0.10 \leq x \leq 0.35$ or $0.15 \leq x \leq 0.30$.

The composition of the second layer is measured by the TEM-EDX. Examples of the measurement device include JEM-ARM300F2 (trade name) provided by JEOL. A specific measurement method is as follows.

A thin-piece sample (hereinafter, also referred to as "cross section sample") with a cross section parallel to the normal direction of the surface of the cutting tool is obtained. The region of the coating film in the cross section sample is observed using the TEM under an acceleration voltage of 200 V at 500,000× to 1,000,000×, thereby obtaining a first image.

Figure 2:
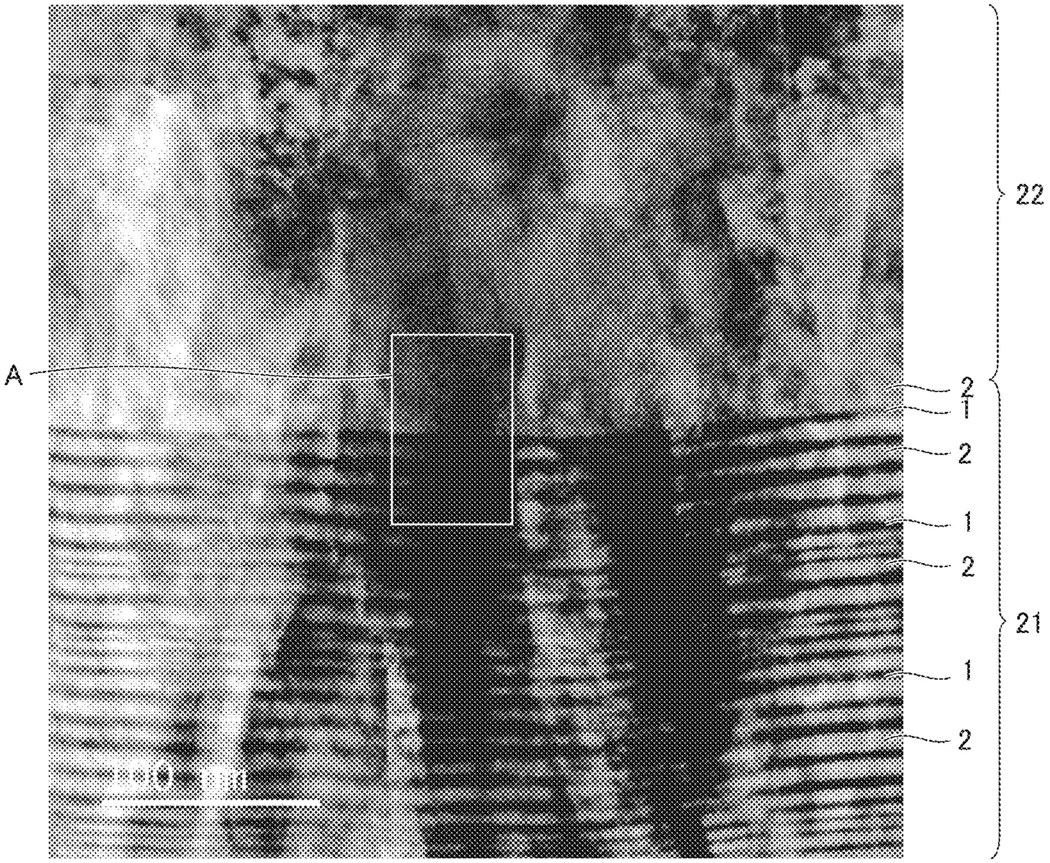
FIG. 2 is an exemplary first image obtained by observing a coating film of the cutting tool according to the first embodiment with a TEM.
Figure 3:
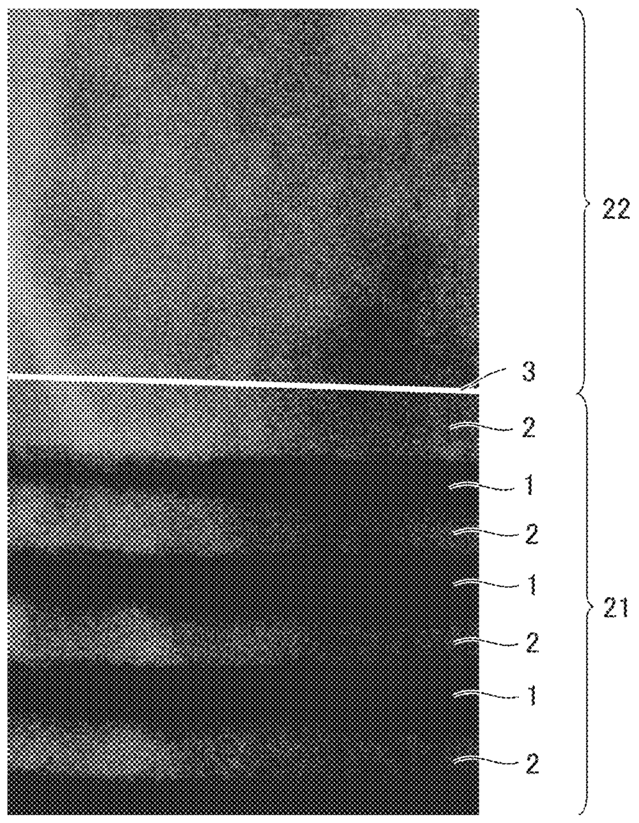
FIG. 3 is an enlarged view of an interface region between a first layer and a second layer in a frame indicated by A in FIG. 2.

FIG. 2 shows an exemplary first image. As shown in FIG. 2, in the first image, a region of a layered body of first unit layers 1 each shown in a dark color and second unit layers 2 each shown in a light color corresponds to first layer 21, whereas a layer in a light color and directly on first layer 21 corresponds to second layer 22. When an interface between second unit layer 2 and second layer 22 is not clear from the difference in contrast and an interface between first layer 21 and second layer 22 is not clear in the first image, a position away from a main surface of first unit layer 1 closest to second layer 22 to the second layer 22 side by the thickness of second unit layer 2 is regarded as interface 3 between first layer 21 and second layer 22 as shown in FIG. 3.

In the first image, a line analysis is performed in a direction from the surface of the coating film toward the interface between the first layer and the second layer along a direction perpendicular to the surface of the coating film. Based on a result of the line analysis, a graph showing changes in content ratios of titanium, carbon, and nitrogen is obtained. Conditions of the line analysis are an acceleration voltage of 200 kV and a step size of 5 nm or less.

The average composition of the second layer is found based on the result of the line analysis. In the second layer, first images at five visual fields that do not overlap with one another are freely obtained, and the above-described line analysis is repeatedly performed based on the first images, thereby finding the average composition of the second layer. In the present disclosure, the average of the five average compositions of the second layer is defined as the composition of the second layer.

As long as the measurement is performed for the same cutting tool, it has been confirmed that there are no variations in measurement results even when the measurement positions are freely selected.

<<First Region and Second Region of Second Layer>>

The second layer includes the first region sandwiched between the first surface of the second layer on the surface side of the coating film and imaginary plane P1 at which the distance from the first surface to the second layer side is 10% with respect to the film thickness of the second layer. When the second layer is provided at the outermost surface of the coating film, the first surface corresponds to the surface of the coating film. When the surface layer is provided on the main surface of the second layer on the surface side of the coating film, the first surface corresponds to an interface between the second layer and the surface layer.

In the first region, average C1 (hereinafter, also referred to as "average C1") of the percentages of the numbers of the carbon atoms with respect to the totals of the numbers of the carbon atoms and the numbers of the nitrogen atoms is 25% or more and 50% or less, may be 33% or more and 47% or less, or may be 36% or more and 44% or less.

The second layer includes the second region sandwiched between the interface between the second layer and the first layer and imaginary plane P2 at which the distance from the interface to the second layer side is 40% with respect to the film thickness of the second layer.

In the second region, average C2 (hereinafter, also referred to as "average C2") of the percentages of the numbers of the carbon atoms with respect to the totals of the numbers of the carbon atoms and the numbers of the nitrogen atoms is 1% or more and 10% or less, may be 1% or more and 9% or less, or may be 2% or more and 8% or less.

A difference C1-C2 between C1 and C2 may be 15% or more and 49% or less, or may be 20% or more and 40% or less.

Figure 4:
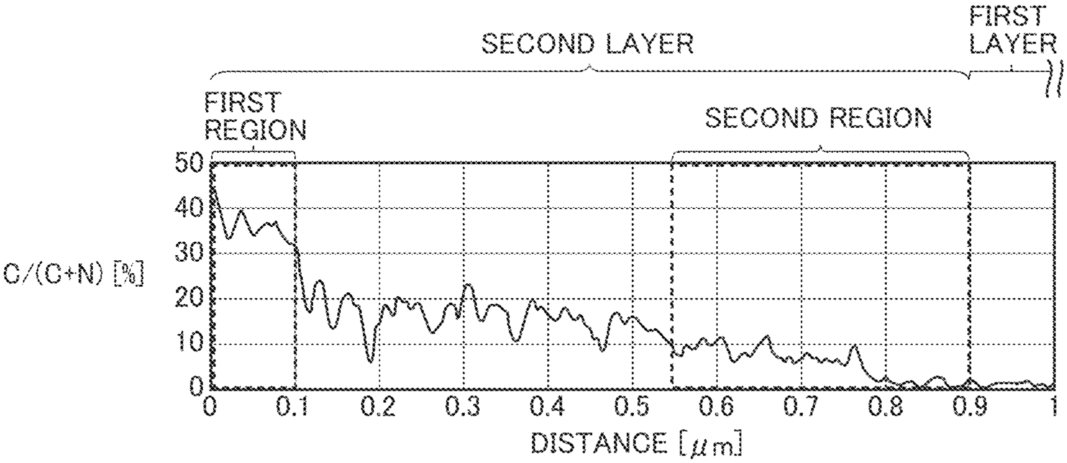
FIG. 4 is an exemplary graph showing a result of a line analysis on the coating film of the cutting tool according to the first embodiment.

A method of measuring each of average C1 and average C2 is as follows. A line analysis is performed onto the second layer in the same manner as in the method of measuring the composition of the second layer. FIG. 4 shows an exemplary graph showing a result of the line analysis. In FIG. 4, the horizontal axis (X axis) represents a distance (μm) from the surface (measurement start point) of the coating film, and the vertical axis (Y axis) represents the percentage (described as "C/(C+N) [%]" in FIG. 4) of the number of the carbon atoms with respect to the total of the number of the carbon atoms and the number of the nitrogen atoms.

Based on the result of the line analysis, average C of the percentages of the numbers of the carbon atoms with respect to the totals of the numbers of the carbon atoms and the numbers of the nitrogen atoms is found in each of the first region and the second region.

In the second layer, first images at five visual fields that do not overlap with one another are freely obtained, the above-described line analysis is repeatedly performed based on the first images, and average C of the percentages of the numbers of the carbon atoms with respect to the totals of the numbers of the carbon atoms and the numbers of the nitrogen atoms is found in each of the first region and the second region. In the present disclosure, the average of five averages C in the first region is defined as average C1 of the percentages of the numbers of the carbon atoms with respect to the totals of the numbers of the carbon atoms and the numbers of the nitrogen atoms in the first region. In the present disclosure, the average of five averages C of carbon in the second region is defined as average C2 of the percentages of the numbers of the carbon atoms with respect to the totals of the numbers of the carbon atoms and the numbers of the nitrogen atoms in the second region.

As long as the measurement is performed for the same cutting tool, it has been confirmed that there are no variations in measurement results even when the measurement positions are freely selected.

The second layer is one layer composed of $TiC_xN_{1-x}$, and average C1 in the first region on the surface side of the coating film and average C2 in the second region in contact with the first layer are different from each other in the one layer. Since the second layer is one layer composed of $TiC_xN_{1-x}$, unlike a case where a two-layer structure consisting of a TiN layer and a TiCN layer is formed on the first layer, detachment between the TiN layer and the TiCN layer, which is likely to occur in the two-layer structure, does not occur, thereby suppressing chipping of the coating film.

In the cutting tool of the first embodiment, a percentage C11, a percentage C12, a percentage C13, and a percentage C14 indicate a relation of C11<C12<C13<C14, percentage C11 being a percentage of the number of carbon atoms with respect to a total of the number of the carbon atoms and the number of nitrogen atoms at the interface between the second layer and the first layer, percentage C12 being a percentage of the number of carbon atoms with respect to a total of the number of the carbon atoms and the number of nitrogen atoms at imaginary plane P2, percentage C13 being a percentage of the number of carbon atoms with respect to a total of the number of the carbon atoms and the number of nitrogen atoms at imaginary plane P1, percentage C14 being a percentage of the number of carbon atoms with respect to a total of the number of the carbon atoms and the number of nitrogen atoms at the first surface.

C11 may be 0% or more and 4% or less, may be 0% or more and 3% or less, or may be 0% or more and 2% or less.

C12 may be 5% or more and 15% or less, may be 6% or more and 14% or less, or may be 7% or more and 13% or less.

C13 may be 20% or more and 40% or less, may be 22% or more and 38% or less, or may be 24% or more and 36% or less.

C14 may be 41% or more and 60% or less, may be 41% or more and 55% or less, or may be 41% or more and 50% or less.

A difference C12-C11 between C11 and C12 may be 1% or more and 15% or less, or may be 3% or more and 14% or less.

A difference C13-C12 between C12 and C13 may be 5% or more and 35% or less, or may be 8% or more and 32% or less.

A difference C14-C13 between C13 and C14 may be 1% or more and 40% or less, or may be 3% or more and 35% or less.

A difference C14-C11 between C11 and C14 may be 37% or more and 60% or less, or may be 38% or more and 55% or less.

Each of C11, C12, C13, and C14 is measured by the line analysis described above. In the second layer, first images at five visual fields that do not overlap with one another are freely obtained, and the above-described line analysis is repeatedly performed based the first images, thereby measuring C11, (C12, C13, and C14. In the present disclosure, the average of C11 at the five visual fields corresponds to C11 at the interface between the second layer and the first layer. In the present disclosure, the average of C12 at the five visual fields corresponds to C12 at imaginary plane P2. In the present disclosure, the average of C13 at the five visual fields corresponds to C13 at imaginary plane P1. In the present disclosure, the average of C14 at the five visual fields corresponds to C14 at the first surface.

As long as the measurement is performed for the same cutting tool, it has been confirmed that there are no variations in measurement results even when the measurement positions are freely selected.

The second layer includes a third region sandwiched between the first region and the second region. The composition of the third region is not particularly limited as long as the composition of the second layer is $TiC_xN_{1-x}$ ($0.05 \leq x \leq 0.40$). In the third region, average C3 of the percentages of the numbers of carbon atoms with respect to totals of the numbers of the carbon atoms and the numbers of nitrogen atoms may be, for example, 10% or more and 30% or less, 12% or more and 25% or less, or 14% or more and 20% or less.

Average C3 of the percentages of the numbers of the carbon atoms with respect to the totals of the numbers of the carbon atoms and the nitrogen atoms in the third region is measured in the same manner as average C1 of the percentages of the numbers of the carbon atoms with respect to the totals of the numbers of the carbon atoms and the numbers of the nitrogen atoms in the first region.

<<Average Thickness of Second Layer>>

The average thickness of the second layer is 0.5 μm or more and 5.0 μm or less, may be 0.7 μm or more and 4.0 μm or less, or may be 1.0 μm or more and 3.0 μm or less. When the average thickness of the second layer is 0.5 μm or more, the lubricity is improved. When the average thickness of the second layer is 5.0 μm or less, the breakage resistance is improved.

<<Lattice Constants of First Region and Second Region>>

The lattice constant of the first region of the second layer may be 4.385 Å or more and 4.405 Å or less, or may be 4.385 Å or more and 4.395 Å or less.

The lattice constant of the second region of the second layer may be 4.355 Å or more and 4.380 Å or less, or may be 4.355 Å or more and 4.370 Å or less. When the lattice constant of the second region is 4.355 Å or more and 4.380 Å or less, the lattice constant of the second region becomes sufficiently small in strain as compared with the lattice constant of TiN of the second unit layer, i.e., 4.353 Å to attain excellent lattice matching, thereby further improving the adhesion between the first layer and the second layer.

Each of the lattice constants of the first region and the second region is found from a diffraction spot of a cubic crystal (111) as observed in an electron diffraction pattern of the TEM. Each of the lattice constants of the first region and the second region is found at any three points in a corresponding one of the regions. In the present disclosure, the average of the three lattice constants in the first region corresponds to the lattice constant of the first region. In the present disclosure, the average of the three lattice constants in the second region corresponds to the lattice constant of the second region. Observation was performed at an acceleration voltage of 200 kV and a camera length of 10 cm, and each of the lattice constants was calculated at an electron beam wavelength of 2.508 μm.

Second Embodiment: Method of Manufacturing Cutting Tool

In a second embodiment, a method of manufacturing the cutting tool of the first embodiment will be described. The manufacturing method of the second embodiment can include: a step of preparing a substrate; and a step of forming a coating film on the substrate. Details of each step will be described below.

<<Step of Preparing Substrate>>

In the step of preparing the substrate, the substrate is prepared. The substrate described in the first embodiment can be used as the substrate.

<<Step of Forming Coating Film>>

In the step of forming the coating film, the coating film is formed on the substrate. In the second embodiment, coating film 20 can be formed by a physical vapor deposition (PVD) method. Specific examples of the PVD method include an arc ion plating (ALP) method, a balanced magnetron sputtering (BMS) method, an unbalanced magnetron sputtering (UBMS) method, and the like. In the second embodiment, it is preferable to use the arc ion plating.

In the AIP method, an arc discharge is generated using a target material as a cathode. Thus, the target material is evaporated and ionized. Then, the ions are deposited on a surface of substrate 10 to which a negative bias voltage has been applied. The AIP method is excellent in terms of a ratio of ionization of the target material.

Figure 5:
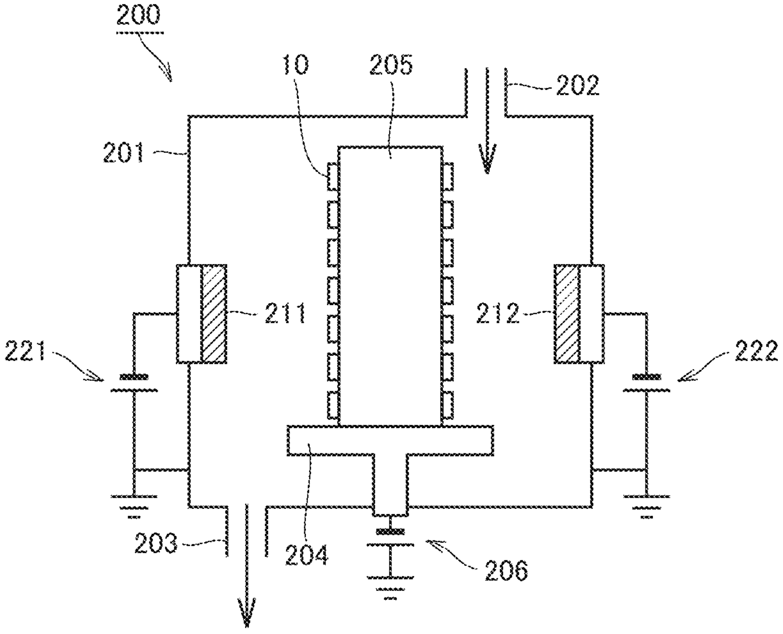
FIG. 5 is a schematic cross sectional view showing an exemplary configuration of a film forming device.

A film forming device used in the AIP method will be described with reference to FIGS. 5 and 6. As shown in FIG. 5, a film forming device 200 includes a chamber 201. Chamber 201 is provided with: a gas introduction port 202 for introducing a source material gas into chamber 201; and a gas exhaust port 203 for exhausting the source material gas from chamber 201 to outside. Gas exhaust port 203 is connected to a vacuum pump (not shown). A pressure in chamber 201 is adjusted by introduction amount and exhaust amount of the gas.

A turntable 204 is disposed in chamber 201. A substrate holder 205 for holding substrate 10 is attached to turntable 204. Substrate holder 205 is connected to the negative electrode of bias power supply 206. The positive electrode of bias power supply 206 is grounded.

Figure 6:
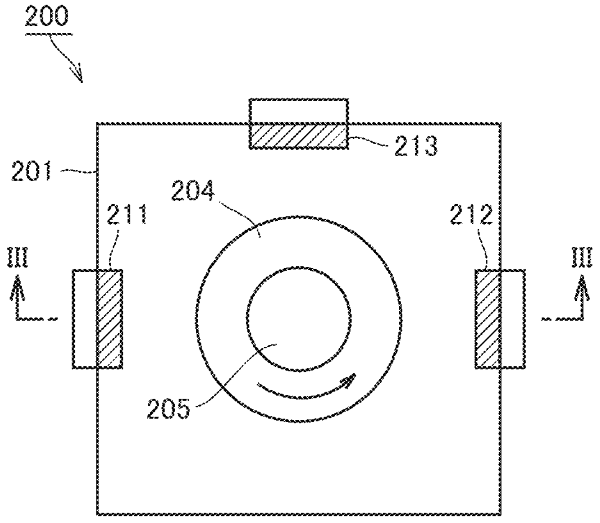
FIG. 6 is a schematic cross sectional view showing an exemplary configuration of the film forming device.
Figure 7:
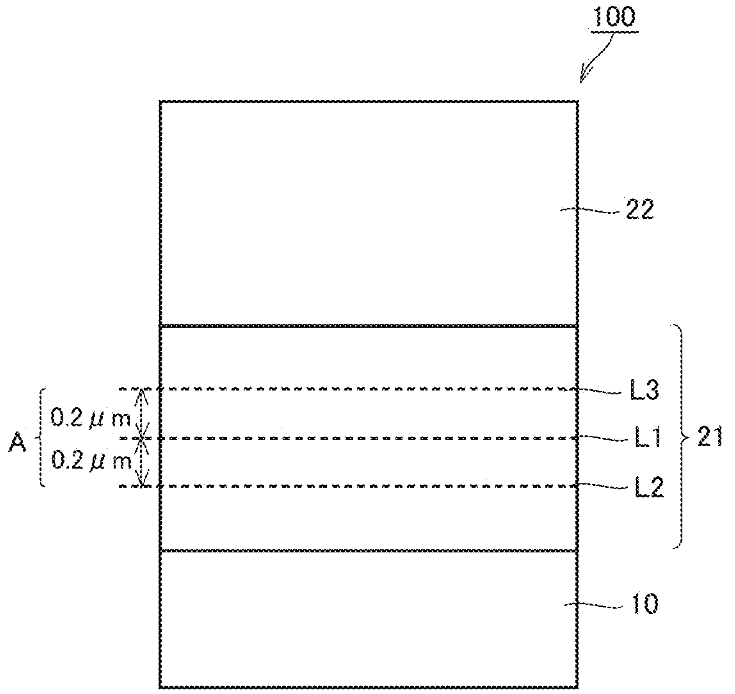
FIG. 7 is a diagram for illustrating a measurement region when measuring a diameter of a maximum inscribed circle of a crystal grain of a first layer.

As shown in FIG. 6, a plurality of target materials 211, 212, 213 are attached to side walls of chamber 201. As shown in FIG. 5, target materials 211, 212 are connected to the negative electrodes of DC power supplies 221, 222, respectively.

Each of DC power supplies 221, 222 is a variable power supply, and has a positive electrode grounded. Although not shown in FIG. 5, the same applies to target material 213. Hereinafter, specific operations will be described.

Substrate 10 is held by substrate holder 205. A pressure in chamber 201 is adjusted to $1.0\times10^{-4}$ Pa using the vacuum pump. The temperature of substrate 10 is adjusted to 500° C. by a heater (not shown) accompanied with film forming device 200, while rotating turntable 204.

An Ar gas is introduced from gas introduction port 202 so as to adjust the pressure in chamber 201 to 3.0 Pa. While maintaining the pressure, the voltage of bias power supply 206 is gradually changed and finally adjusted to −1000 V. Then, the surface of substrate 10 is cleaned by ion bombardment treatment using Ar ions.

Next, when the coating film includes an underlying layer, the underlying layer is formed on the surface of substrate 10. For example, a TiAlN layer, a TiAlSiN layer, or a TiAlBN layer is formed on the surface of substrate 10.

Next, the first layer is formed on the surface of substrate 10 or the surface of the underlying layer. The composition of each target material is selected to obtain the compositions of the first unit layer and the second unit layer. Each target material is set at a predetermined position, a nitrogen gas is introduced from gas introduction port 202, and the first layer is formed while rotating turntable 204. When forming the first layer, the substrate temperature is set to 600 to 800° C., the nitrogen gas pressure is set to 2 to 8 Pa, the voltage of the bias power supply is set to −200 to −30 V (DC power supply), and an arc current of 100 to 200 A is alternately supplied to an evaporation source for forming the first unit layer and an evaporation source for forming the second unit layer. Thus, metal ions are generated from the evaporation source for forming the first unit layer and the evaporation source for forming the second unit layer, with the result that the first unit layer is formed when the substrate faces the evaporation source for forming the first unit layer and the second unit layer is formed when the substrate faces the evaporation source for forming the second unit layer. When forming the second layer, the rotation speed of the substrate is adjusted to adjust the thickness of each of the first unit layer and the second unit layer. Further, the film formation time is adjusted to adjust the thickness of the second layer to fall within a predetermined range.

Next, the second layer is formed on the first layer. When forming the second layer, the substrate temperature is set to 400 to 600° C., the reaction gas pressure is set to 5.0 to 10.0 Pa, the voltage of the bias power supply is set to −650 to −400 V (DC power supply), and an arc current of 100 A to 200 A is alternately supplied to the evaporation source for forming the second layer. The composition of the target material is Ti. The target material is set at a predetermined position, nitrogen gas and methane gas or acetylene gas are introduced as a reaction gas from gas introduction port 202, and the second layer is formed while rotating turntable 204. A flow rate ratio of the methane gas or the acetylene gas with respect to the nitrogen gas in the reaction gas is adjusted to be increased in response to an increase in time from the start of the formation of the second layer. For example, when the nitrogen gas and the methane gas are used as the reaction gas, the flow rate ratio of the nitrogen gas and the methane gas in the reaction gas is adjusted such that the flow rate ratio of the methane gas with respect to the nitrogen gas in the reaction gas is increased in the range of the nitrogen gas:the methane gas=10:1 to 1:1.

Next, when the coating film includes a surface layer, the surface layer is formed on the surface of the first layer, for example.

In this way, the cutting tool including the substrate and the coating film provided on the substrate can be manufactured.

EXAMPLES

The present embodiment will be described more specifically with reference to examples. However, the present embodiment is not limited by these examples.

<Production of Cutting Tool>

Each of cutting tools was produced in the below-described manner and was evaluated in terms of tool life.

As the substrate, a cutting insert (model number: CNMG120408 (provided by Sumitomo Electric Hardmetal)) composed of a cemented carbide was prepared. The cemented carbide includes WC grains (90 mass %) and Co (10 mass %). The average grain size of the WC grains is 1 to 2 μm.

A coating film was formed on the substrate by using a film forming device having the configuration shown in FIGS. 5 and 6. First, the substrate was subjected to ion bombardment treatment using Ar ions, thereby cleaning the surface of the substrate. Specific conditions of the ion bombardment treatment are described in the second embodiment.

Next, target materials were set at predetermined positions of the film forming device. The composition of each target material was adjusted so as to obtain compositions of the first unit layer and the second unit layer as described in Tables 3 and 4 and a composition of the second layer as described in Tables 5 and 6.

The first layer was formed on the substrate. Specifically, a nitrogen gas was introduced from the gas introduction port, and the first and second unit layers were alternately formed while rotating the turntable, thereby forming the first layer. An arc current of 150 A was alternately supplied to the evaporation source for forming the first unit layer and the evaporation source for forming the second unit layer, under conditions that the substrate temperature was 700° C., the nitrogen gas pressure was 5 Pa, and the voltage of the bias power supply was −50 V (DC power supply). Each of the thickness of each of the first and second unit layers, the number of the layered first unit layers, and the number of the layered second unit layers were adjusted by the rotation speed of the substrate so as to obtain the numbers of the layered layers as shown in Tables 3 and 4. The arc current value of each target material was appropriately adjusted for several seconds before the end of the film formation of the first layer such that the surface of the first layer was the second unit layer.

Next, the second layer was formed on the second unit layer of the first layer. Specifically, a nitrogen gas and a methane gas were introduced from the gas introduction port, and the second layer was formed while rotating the turntable. Conditions for forming the second layer of each sample were as follows, the substrate temperature was 500° C., the reaction gas pressure was 7 Pa, and the arc current of 150 A was supplied to the evaporation source for forming the second layer while the voltage of the bias power supply was oscillated from −600 to −500 V (DC power supply). The nitrogen gas and the methane gas were introduced as the reaction gas from gas introduction port 202, and the second layer was formed while rotating turntable 204. In response to increase in the time from the start of the formation of the second layer, the percentage (hereinafter, also referred to as "flow rate ratio $CH_4/(N_2+CH_4)$") of the flow rate of the methane gas with respect to the total of the flow rate of the nitrogen gas and the flow rate of the methane gas was changed so as to become a percentage described in "Start of Film Formation" to "End of Film Formation" in Tables 1 and 2. On this occasion, the flow rate ratio $CH_4/(N_2+CH_4)$ was adjusted to be gradually increased. The thickness of the second layer was adjusted by the rotation speed of the substrate. By the above steps, the cutting tools of the respective samples were obtained.

[Table 1]

TABLE 1

| | Film Formation Condition Second Layer Flow Rate Ratio $CH_4/(N_2 + CH_4)$ | |
|---|---|---|
| Sample No. | Start of Film Formation % | End of Film Formation % |
| 1 | 10 | 50 |
| 2 | 10 | 50 |
| 3 | 10 | 50 |
| 4 | 10 | 50 |
| 5 | 10 | 50 |
| 6 | 10 | 50 |
| 7 | 10 | 50 |
| 8 | 15 | 55 |
| 9 | 5 | 50 |
| 10 | 5 | 45 |
| 11 | 20 | 70 |
| 12 | 20 | 70 |
| 13 | 5 | 50 |
| 14 | 15 | 70 |
| 15 | 5 | 50 |
| 16 | 15 | 55 |
| 17 | 15 | 50 |
| 18 | 10 | 50 |
| 19 | 15 | 55 |
| 20 | 10 | 45 |
| 21 | 10 | 50 |
| 22 | 10 | 50 |
| 23 | 10 | 60 |
| 24 | 10 | 45 |
| 25 | 10 | 50 |

[Table 2]

TABLE 2

| | Film Formation Condition Second Layer Flow Rate Ratio $CH_4/(N_2 + CH_4)$ | |
|---|---|---|
| Sample No. | Start of Film Formation % | End of Film Formation % |
| 1-1 | 10 | 55 |
| 1-2 | 10 | 50 |
| 1-3 | 10 | 50 |
| 1-4 | 10 | 50 |
| 1-5 | 15 | 55 |
| 1-6 | 15 | 55 |
| 1-7 | 15 | 50 |
| 1-8 | 15 | 60 |
| 1-9 | 10 | 60 |
| 1-10 | 10 | 60 |
| 1-11 | 0 | 50 |

TABLE 2-continued

| | Film Formation Condition Second Layer Flow Rate Ratio $CH_4/(N_2 + CH_4)$ | |
|---|---|---|
| Sample No. | Start of Film Formation % | End of Film Formation % |
| 1-12 | 20 | 70 |
| 1-13 | 10 | 50 |
| 1-14 | 10 | 60 |
| 1-15 | 10 | 45 |
| 1-16 | 10 | 55 |
| 1-17 | 0 | 45 |

Evaluations

<<Configuration of Coating Film>

For the coating film of each sample, the following items were measured: the compositions of the first unit layer and the second unit layer; the average thickness of each layer; average T1 of the percentages of the numbers of the titanium atoms with respect to the totals of the numbers of the titanium atoms and the numbers of the aluminum atoms in the first layer; the composition of the second layer; average C1 of the percentages of the numbers of the carbon atoms with respect to the totals of the numbers of the carbon atoms and the numbers of the nitrogen atoms in the first region; average C2 of the percentages of the numbers of the carbon atoms with respect to the totals of the numbers of the carbon atoms and the numbers of the nitrogen atoms in the second region; percentage C11 of the number of the carbon atoms with respect to the total of the number of the carbon atoms and the number of the nitrogen atoms at the interface between the second layer and the first layer; percentage C12 of the number of the carbon atoms with respect to the total of the number of the carbon atoms and the number of the nitrogen atoms at imaginary plane P2; percentage C13 of the number of the carbon atoms with respect to the total of the number of the carbon atoms and the number of nitrogen atoms at imaginary plane P1; percentage C14 of the number of the carbon atoms with respect to the total of the number of the carbon atoms and the number of the nitrogen atoms at the first surface; and the lattice constants of the first region and the second region. The method of measuring each item is described in the first embodiment. Results are shown in Tables 3 to 6.

[Table 3]

TABLE 3

| | Coating Film First Layer | | | | | | |
|---|---|---|---|---|---|---|---|
| | First Unit Layer ($Ti_aAl_{1-a-b}B_bN$) | | | Second Unit Layer (TiN) | | | |
| Sample No. | a | b | Average Thickness nm | Average Thickness nm | T1 % | Number of Layered Layers | Thickness μm |
| 1 | 0.400 | 0.050 | 12 | 11 | 69 | 100 | 2.3 |
| 2 | 0.300 | 0.005 | 22 | 22 | 65 | 50 | 2.2 |
| 3 | 0.300 | 0.050 | 23 | 22 | 64 | 50 | 2.3 |
| 4 | 0.300 | 0.100 | 27 | 27 | 65 | 50 | 2.7 |
| 5 | 0.500 | 0.010 | 23 | 24 | 76 | 50 | 2.4 |
| 6 | 0.500 | 0.050 | 26 | 27 | 75 | 50 | 2.7 |
| 7 | 0.500 | 0.100 | 22 | 21 | 74 | 50 | 2.2 |
| 8 | 0.420 | 0.070 | 50 | 50 | 71 | 40 | 4.0 |

TABLE 3-continued

| Sample No. | Coating Film First Layer: First Unit Layer ($Ti_aAl_{1-a-b}B_bN$) a | b | Average Thickness nm | Second Unit Layer (TiN) Average Thickness nm | T1 % | Number of Layered Layers | Thickness µm |
|---|---|---|---|---|---|---|---|
| 9 | 0.310 | 0.050 | 5 | 5 | 66 | 450 | 4.5 |
| 10 | 0.490 | 0.040 | 5 | 5 | 75 | 450 | 4.5 |
| 11 | 0.380 | 0.010 | 10 | 10 | 69 | 30 | 0.6 |
| 12 | 0.400 | 0.010 | 10 | 10 | 70 | 200 | 4.0 |
| 13 | 0.410 | 0.090 | 4 | 4 | 71 | 600 | 4.8 |
| 14 | 0.370 | 0.050 | 12 | 12 | 69 | 100 | 2.4 |
| 15 | 0.390 | 0.040 | 5 | 5 | 70 | 450 | 4.5 |
| 16 | 0.420 | 0.050 | 2 | 50 | 98 | 75 | 3.9 |
| 17 | 0.410 | 0.050 | 3 | 49 | 97 | 75 | 3.9 |
| 18 | 0.430 | 0.040 | 18 | 8 | 61 | 100 | 2.6 |
| 19 | 0.330 | 0.060 | 3 | 2 | 60 | 500 | 2.5 |
| 20 | 0.350 | 0.030 | 5 | 5 | 68 | 50 | 0.5 |
| 21 | 0.380 | 0.040 | 5 | 6 | 72 | 50 | 0.6 |
| 22 | 0.420 | 0.060 | 6 | 6 | 71 | 410 | 4.9 |
| 23 | 0.440 | 0.070 | 5 | 5 | 72 | 500 | 5.0 |
| 24 | 0.410 | 0.050 | 11 | 12 | 72 | 100 | 2.3 |
| 25 | 0.400 | 0.060 | 12 | 12 | 70 | 100 | 2.4 |

[Table 4]

TABLE 4

| Sample No. | Coating Film First Layer: First Unit Layer ($Ti_aAl_{1-a-b}B_bN$) a | b | Average Thickness nm | Second Unit Layer (TiN) Average Thickness nm | T1 % | Number of Layered Layers | Thickness µm |
|---|---|---|---|---|---|---|---|
| 1-1 | 0.290 | 0.050 | 25 | 25 | 65 | 50 | 2.5 |
| 1-2 | 0.510 | 0.040 | 24 | 25 | 76 | 50 | 2.5 |
| 1-3 | 0.400 | 0.000 | 23 | 23 | 70 | 50 | 2.3 |
| 1-4 | 0.400 | 0.110 | 24 | 25 | 71 | 50 | 2.5 |
| 1-5 | 0.400 | 0.060 | 1.9 | 40 | 97 | 100 | 4.2 |
| 1-6 | 0.410 | 0.060 | 51 | 26 | 61 | 50 | 3.9 |
| 1-7 | 0.330 | 0.060 | 3 | 1.9 | 59 | 500 | 2.5 |
| 1-8 | 0.430 | 0.060 | 24 | 51 | 82 | 50 | 3.8 |
| 1-9 | 0.360 | 0.030 | 5 | 5 | 68 | 40 | 0.4 |
| 1-10 | 0.450 | 0.070 | 5 | 5 | 73 | 510 | 5.1 |
| 1-11 | 0.410 | 0.040 | 4 | 4 | 71 | 600 | 4.8 |
| 1-12 | 0.390 | 0.060 | 10 | 9 | 68 | 200 | 3.8 |
| 1-13 | 0.400 | 0.050 | 10 | 10 | 70 | 100 | 2.0 |
| 1-14 | 0.460 | 0.080 | 5 | 5 | 73 | 450 | 4.5 |
| 1-15 | 0.360 | 0.030 | 5 | 5 | 68 | 40 | 0.4 |
| 1-16 | 0.450 | 0.070 | 5 | 5 | 73 | 510 | 5.1 |
| 1-17 | 0.400 | 0.040 | 11 | 11 | 70 | 100 | 2.2 |

[Table 5]

TABLE 5

| Sample No. | Coating Film Second Layer ($TiC_xN_{1-x}$) x | First Region C1 % | Second Region C2 % | C11 % | C12 % | C13 % | C14 % | First Region Lattice Constant Å | Second Region Lattice Constant Å | Thickness µm | Entire Thickness µm |
|---|---|---|---|---|---|---|---|---|---|---|---|
| 1 | 0.20 | 39 | 6 | 2 | 9 | 32 | 45 | 4.389 | 4.362 | 1.9 | 4.2 |
| 2 | 0.20 | 39 | 5 | 2 | 8 | 29 | 48 | 4.389 | 4.362 | 2.1 | 4.3 |
| 3 | 0.18 | 35 | 5 | 2 | 8 | 32 | 45 | 4.385 | 4.362 | 2.0 | 4.3 |
| 4 | 0.19 | 38 | 5 | 2 | 8 | 31 | 44 | 4.388 | 4.362 | 2.0 | 4.7 |
| 5 | 0.18 | 36 | 6 | 1 | 10 | 28 | 43 | 4.386 | 4.362 | 1.9 | 4.3 |
| 6 | 0.19 | 38 | 5 | 1 | 9 | 30 | 45 | 4.388 | 4.362 | 2.0 | 4.7 |
| 7 | 0.20 | 39 | 5 | 2 | 8 | 32 | 45 | 4.389 | 4.362 | 2.1 | 4.3 |
| 8 | 0.20 | 38 | 8 | 3 | 12 | 25 | 51 | 4.388 | 4.366 | 2.4 | 6.4 |
| 9 | 0.06 | 26 | 2 | 0.5 | 5 | 21 | 42 | 4.378 | 4.356 | 2.0 | 6.5 |
| 10 | 0.06 | 27 | 2 | 0 | 6 | 21 | 41 | 4.379 | 4.356 | 2.0 | 6.5 |
| 11 | 0.39 | 49 | 9 | 3 | 14 | 39 | 59 | 4.398 | 4.367 | 2.0 | 2.6 |
| 12 | 0.40 | 50 | 10 | 4 | 15 | 40 | 60 | 4.399 | 4.369 | 4.0 | 8.0 |
| 13 | 0.05 | 25 | 1 | 0 | 5 | 20 | 42 | 4.376 | 4.355 | 3.1 | 7.9 |
| 14 | 0.39 | 48 | 8 | 3.5 | 13 | 38 | 57 | 4.397 | 4.367 | 2.0 | 4.4 |
| 15 | 0.06 | 29 | 2 | 1 | 6 | 22 | 43 | 4.380 | 4.357 | 2.9 | 7.4 |
| 16 | 0.20 | 38 | 7 | 3 | 11 | 27 | 49 | 4.388 | 4.365 | 2.3 | 6.2 |
| 17 | 0.20 | 39 | 7 | 3 | 10 | 32 | 45 | 4.389 | 4.364 | 2.1 | 6.0 |
| 18 | 0.19 | 37 | 5 | 2 | 8 | 31 | 46 | 4.387 | 4.362 | 2.0 | 4.6 |
| 19 | 0.20 | 39 | 7 | 2 | 11 | 29 | 49 | 4.389 | 4.364 | 1.8 | 4.3 |
| 20 | 0.18 | 35 | 5 | 1 | 8 | 30 | 39 | 4.385 | 4.361 | 0.5 | 1.0 |
| 21 | 0.19 | 37 | 6 | 2 | 10 | 28 | 45 | 4.387 | 4.363 | 0.6 | 1.1 |
| 22 | 0.20 | 39 | 5 | 2 | 8 | 32 | 45 | 4.389 | 4.362 | 4.9 | 9.8 |
| 23 | 0.21 | 42 | 6 | 2 | 9 | 32 | 52 | 4.392 | 4.362 | 5.0 | 10.0 |
| 24 | 0.20 | 38 | 6 | 2 | 10 | 38 | 38 | 4.388 | 4.363 | 1.8 | 4.1 |
| 25 | 0.19 | 38 | 5 | 5 | 5 | 31 | 44 | 4.388 | 4.362 | 1.9 | 4.3 |

[Table 6]

TABLE 6

| | Coating Film | | | | | | | | | | |
|---|---|---|---|---|---|---|---|---|---|---|---|
| | Second Layer ($TiC_xN_{1-x}$) | | | | | | | | | | |
| Sample No. | x | First Region C1 % | Second Region C2 % | C11 % | C12 % | C13 % | C14 % | First Region Lattice Constant Å | Second Region Lattice Constant Å | Thickness μm | Entire Thickness μm |
| 1-1 | 0.20 | 40 | 6 | 3 | 8 | 30 | 49 | 4.390 | 4.362 | 2.1 | 4.6 |
| 1-2 | 0.19 | 37 | 6 | 1 | 10 | 29 | 44 | 4.387 | 4.362 | 1.9 | 4.4 |
| 1-3 | 0.20 | 39 | 5 | 2 | 8 | 29 | 48 | 4.389 | 4.362 | 2.2 | 4.5 |
| 1-4 | 0.20 | 39 | 6 | 3 | 8 | 29 | 48 | 4.389 | 4.362 | 2.2 | 4.7 |
| 1-5 | 0.21 | 39 | 7 | 3 | 11 | 29 | 49 | 4.389 | 4.365 | 2.3 | 6.5 |
| 1-6 | 0.21 | 39 | 7 | 3 | 11 | 27 | 51 | 4.389 | 4.365 | 2.2 | 6.1 |
| 1-7 | 0.20 | 38 | 7 | 2 | 12 | 29 | 48 | 4.388 | 4.365 | 1.9 | 4.4 |
| 1-8 | 0.21 | 39 | 8 | 3 | 12 | 26 | 51 | 4.389 | 4.366 | 2.2 | 6.0 |
| 1-9 | 0.19 | 37 | 5 | 2 | 8 | 32 | 41 | 4.387 | 4.362 | 0.7 | 1.1 |
| 1-10 | 0.21 | 42 | 6 | 2 | 10 | 33 | 50 | 4.391 | 4.363 | 4.7 | 9.8 |
| 1-11 | 0.04 | 24 | 0 | 0 | 0 | 20 | 41 | 4.376 | 4.354 | 3.2 | 8.0 |
| 1-12 | 0.41 | 51 | 11 | 5 | 16 | 41 | 61 | 4.400 | 4.371 | 4.0 | 7.8 |
| 1-13 | 0.20 | 39 | 5 | 2 | 8 | 32 | 45 | 4.389 | 4.362 | 0.4 | 2.4 |
| 1-14 | 0.21 | 42 | 6 | 2 | 9 | 32 | 51 | 4.391 | 4.362 | 5.1 | 9.6 |
| 1-15 | 0.17 | 34 | 4 | 1 | 7 | 29 | 39 | 4.385 | 4.360 | 0.5 | 0.9 |
| 1-16 | 0.21 | 41 | 6 | 3 | 9 | 33 | 49 | 4.391 | 4.363 | 5.0 | 10.1 |
| 1-17 | 0.08 | 40 | 0 | 0 | 0 | 40 | 40 | 4.390 | 4.353 | 2.0 | 4.2 |

<Cutting Test 1>

Each of the cutting tools of the samples was used to perform turning under the below-described conditions, and a cutting time until the width of crater wear reached 0.3 mm was measured. It is indicated that as the cutting time is longer, the crater wear resistance is more excellent and the tool life is longer. Results are shown in the column "Cutting Time" of "Cutting Test 1" in Tables 7 and 8.

<<Cutting Conditions>>

Workpiece: SUS316, round material
Cutting speed: 150 m/min
Feed amount: 0.2 mm/rev
Cut-in amount: 2.0 mm
Wet type
The above cutting conditions correspond to a continuous turning process for stainless steel.

<Cutting Test 2>

A turning process was performed using the cutting tool of each sample under the below-described conditions so as to measure a cutting time until the width of breakage measured from the flank face became 0.5 mm or more. It is indicated that as the cutting time is longer, the crater wear resistance and the breakage resistance are more excellent and the tool life is longer. Results are shown in the column "Cutting Time" of "Cutting Test 2" in Tables 7 and 8.

(Cutting Conditions)

Workpiece: SUS316, round material
Cutting speed: 70 m/min
Feed amount: 0.25 mm/rev
Cut-in amount: 1.0 mm
Wet type The above cutting conditions correspond to an intermittent turning process for stainless steel.

<Evaluation Criteria for Tool Life> in the present disclosure, when the cutting time in cutting test 1 is 60 minutes or more and the cutting time in cutting test 2 is 30 minutes or more, it is determined that the cutting tool has along tool life in a process for stainless steel.

[Table 7]

TABLE 7

| Sample No. | Cutting Test 1 Cutting Time Minute | Cutting Test 2 Cutting Time Minute |
|---|---|---|
| 1 | 90 | 45 |
| 2 | 70 | 45 |
| 3 | 75 | 45 |
| 4 | 75 | 45 |
| 5 | 75 | 40 |
| 6 | 75 | 45 |
| 7 | 70 | 40 |
| 8 | 65 | 45 |
| 9 | 70 | 35 |
| 10 | 80 | 35 |
| 11 | 65 | 40 |
| 12 | 85 | 35 |
| 13 | 75 | 35 |
| 14 | 80 | 40 |
| 15 | 80 | 35 |
| 16 | 60 | 45 |
| 17 | 60 | 45 |
| 18 | 65 | 45 |
| 19 | 65 | 40 |
| 20 | 60 | 45 |
| 21 | 60 | 45 |
| 22 | 75 | 30 |
| 23 | 75 | 30 |
| 24 | 85 | 30 |
| 25 | 85 | 30 |

[Table 8]

TABLE 8

| Sample No. | Cutting Test 1 Cutting Time Minute | Cutting Test 2 Cutting Time Minute |
|---|---|---|
| 1-1 | 40 | 35 |
| 1-2 | 40 | 40 |
| 1-3 | 40 | 35 |
| 1-4 | 40 | 35 |
| 1-5 | 30 | 40 |
| 1-6 | 35 | 20 |
| 1-7 | 40 | 40 |
| 1-8 | 35 | 20 |
| 1-9 | 25 | 45 |
| 1-10 | 40 | 30 |
| 1-11 | 75 | 15 |
| 1-12 | 70 | 15 |
| 1-13 | 45 | 20 |
| 1-14 | 70 | 15 |
| 1-15 | 20 | 40 |
| 1-16 | 35 | 15 |
| 1-17 | 85 | 10 |

Review

Each of the cutting tools of samples 1 to 25 corresponds to an example of the present disclosure. It was confirmed that each of these cutting tools has a long tool life in a process for stainless steel.

Each of the cutting tools of samples 1-1 to 1-17 correspond to a comparative example. It was confirmed that each of these cutting tools has an insufficient tool life in a process for stainless steel.

Heretofore, the embodiments and examples of the present disclosure have been illustrated, but it has been initially expected to appropriately combine the configurations of the embodiments and examples and modify them in various manners. The embodiments and examples disclosed herein are illustrative and non-restrictive in any respect. The scope of the present invention is defined by the terms of the claims, rather than the embodiments and examples described above, and is intended to include any modifications within the scope and meaning equivalent to the terms of the claims.

REFERENCE SIGNS LIST

1 first unit layer; 2 second unit layer; 3 interface; 10 substrate; 20 coating film; 21 first layer; 22 second layer; 22*a* first region; 22*b* second region; 23 first surface; 24, 24*a*, 24*b*, 24*c* crystal grain; 25 crystal grain boundary; 50 atom; 100 cutting tool; 200 film forming device; 201 chamber; 202 gas introduction port; 203 gas exhaust port; 204 turntable; 205 substrate holder; 206 bias power supply; 211, 212, 213 target material; 221, 222 DC power supply.

The invention claimed is:

1. A cutting tool comprising: a substrate; and a coating film provided on the substrate, wherein the coating film includes a first layer provided on the substrate and a second layer provided directly on the first layer, the first layer consists of a multilayer structure in which two types of unit layers consisting of a first unit layer and a second unit layer are alternately layered, the first unit layer is composed of $Ti_aAl_{1-a-b}B_bN$, the second unit layer is composed of TiN, where $$0.30 \leq a \leq 0.50 \text{ and } 0.005 \leq b \leq 0.10,$$

in the first layer, an average T1 of percentages of the numbers of titanium atoms with respect to totals of the numbers of the titanium atoms and the numbers of aluminum atoms is 60% or more, an average thickness of the first unit layer is 2 nm or more and 50 nm or less, an average thickness of the second unit layer is 2 nm or more and 50 nm or less, in the first layer, a unit layer in contact with the second layer is the second unit layer, a thickness of the first layer is 0.5 μm or more and 5 μm or less, the second layer is composed of $TiC_xN_{1-x}$, where $$0.05 \leq x \leq 0.40,$$

the second layer includes a first region sandwiched between a first surface of the second layer on a surface side of the coating film and an imaginary plane P1 at which a distance from the first surface to the second layer side is 10% with respect to a film thickness of the second layer, and a second region sandwiched between an interface between the second layer and the first layer and an imaginary plane P2 at which a distance from the interface to the second layer side is 40% with respect to the film thickness of the second layer, in the first region, an average C1 of percentages of the numbers of carbon atoms with respect to totals of the numbers of the carbon atoms and the numbers of nitrogen atoms is 25% or more and 50% or less, in the second region, an average C2 of percentages of the numbers of carbon atoms with respect to totals of the numbers of the carbon atoms and the numbers of nitrogen atoms is 1% or more and 10% or less, and the thickness of the second layer is 0.5 μm or more and 5.0 μm or less.

2. The cutting tool according to claim 1, wherein a percentage C11, a percentage C12, a percentage C13, and a percentage C14 indicate a relation of $C11<C12<C13<C14$, the percentage C11 being a percentage of the number of carbon atoms with respect to a total of the number of the carbon atoms and the number of nitrogen atoms at the interface between the second layer and the first layer, the percentage C12 being a percentage of the number of carbon atoms with respect to a total of the number of the carbon atoms and the number of nitrogen atoms at the imaginary plane P2, the percentage C13 being a percentage of the number of carbon atoms with respect to a total of the number of the carbon atoms and the number of nitrogen atoms at the imaginary plane P1, the percentage C14 being a percentage of the number of carbon atoms with respect to a total of the number of the carbon atoms and the number of nitrogen atoms at the first surface.

3. The cutting tool according to claim 1, wherein a thickness of the coating film is 1.0 μm or more and 10 μm or less.

* * * * *